United States Patent
Cai et al.

(10) Patent No.: US 10,879,857 B2
(45) Date of Patent: Dec. 29, 2020

(54) POWER AMPLIFIER, RADIO REMOTE UNIT, AND BASE STATION

(71) Applicant: HUAWEI TECHNOLOGIES CO., LTD., Shenzhen (CN)

(72) Inventors: Zhonghua Cai, Shanghai (CN); Lipeng Zhang, Shanghai (CN); Kaizhan Wang, Shanghai (CN); Zhiyuan Pang, Shanghai (CN); Sheng Zhu, Shanghai (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 16/365,783

(22) PCT Filed: Sep. 27, 2016

(86) PCT No.: PCT/CN2016/100415
§ 371 (c)(1),
(2) Date: Mar. 27, 2019

(87) PCT Pub. No.: WO2018/058323
PCT Pub. Date: Apr. 5, 2018

(65) Prior Publication Data
US 2019/0341894 A1  Nov. 7, 2019

(51) Int. Cl.
*H03F 3/217* (2006.01)
*H03F 3/21* (2006.01)
(Continued)

(52) U.S. Cl.
CPC .............. *H03F 3/211* (2013.01); *H03F 1/56* (2013.01); *H03F 3/193* (2013.01); *H03F 3/2178* (2013.01);
(Continued)

(58) Field of Classification Search
CPC ....................................................... H03F 3/217
(Continued)

(56) References Cited

U.S. PATENT DOCUMENTS

| 4,812,686 | A   | 3/1989  | Morse |                    |
|-----------|-----|---------|-------|--------------------|
| 7,835,531 | B2* | 11/2010 | Nell  | ......... H04R 3/00 |
|           |     |         |       | 330/297            |

(Continued)

FOREIGN PATENT DOCUMENTS

| CN | 1538763   | A | 10/2004 |
| CN | 103367336 | A | 10/2013 |

(Continued)

OTHER PUBLICATIONS

Ferreira C et al: ""New notch low pass filter for use in switching audio amplification"",Power Electronics Specialists Conference, 2008. PESC 2008. IEEE, Jun. 15, 2008, pp. 1905-1911, XP031300245.
(Continued)

*Primary Examiner* — Henry Choe
(74) *Attorney, Agent, or Firm* — Kilpatrick Townsend & Stockton LLP (57) ABSTRACT

Embodiments of the present invention provide a power amplifier, a radio remote unit RRU, and a base station. A multiphase pulse width modulator performs modulation to generate N multiphase pulse-width modulation PWM signals. The multiphase pulse-width modulation PWMn signal may be amplified. The multiphase pulse-width modulation PWMn signal may be filtered and a combination may be performed at a drain or a collector of a power amplifier transistor. According to the new radio frequency amplifier in accordance with the disclosure, envelope feeding loop inductance can be effectively reduced, so that video bandwidth is increased and DPD correction performance is improved.

9 Claims, 6 Drawing Sheets

(51) Int. Cl.
*H03F 1/56* (2006.01)
*H03F 3/193* (2006.01)
*H04W 88/08* (2009.01)

(52) U.S. Cl.
CPC .. *H03F 2200/165* (2013.01); *H03F 2200/351* (2013.01); *H03F 2200/387* (2013.01); *H03F 2200/451* (2013.01); *H03F 2203/21112* (2013.01); *H03F 2203/21139* (2013.01); *H04W 88/08* (2013.01)

(58) Field of Classification Search
USPC ........................................ 330/10, 251, 207 A
See application file for complete search history.

(56) References Cited

U.S. PATENT DOCUMENTS

| | | | |
|---|---|---|---|
| 7,855,599 | B2 | 12/2010 | Yamanouchi |
| 2004/0239416 | A1 | 12/2004 | Smiley et al. |
| 2006/0178119 | A1 | 8/2006 | Jarvinen |
| 2008/0197901 | A1 | 8/2008 | Cruz-Hernandez et al. |
| 2009/0315620 | A1 | 12/2009 | Yamanouchi et al. |
| 2013/0257564 | A1 | 10/2013 | Huang et al. |
| 2015/0222237 | A1* | 8/2015 | Cotton .................... H03F 3/183 381/120 |
| 2016/0065148 | A1* | 3/2016 | Liu ........................ H03F 3/2171 330/251 |
| 2016/0218703 | A1 | 7/2016 | Nielsen et al. |
| 2017/0155364 | A1 | 6/2017 | Zhang et al. |
| 2018/0241363 | A1* | 8/2018 | Kiyono ................. H03F 3/2173 |
| 2019/0222182 | A1* | 7/2019 | Togawa ................. H03F 3/217 |

FOREIGN PATENT DOCUMENTS

| | | |
|---|---|---|
| CN | 104135254 A | 11/2014 |
| CN | 105518991 A | 4/2016 |
| CN | 105556836 A | 5/2016 |
| CN | 105720933 A | 6/2016 |
| EP | 2533421 A1 | 12/2012 |
| JP | 2006093872 A | 4/2006 |
| WO | 2016075881 A1 | 5/2016 |

OTHER PUBLICATIONS

Jennifer N Kuchen et al: ""Polar SiGe Class E and F Amplifiers Using Switch-Mode Supply Modulation"", IEEE Transactions on Microwave Theory Andtechniques, Plenum, USA, vol. 55, No. 5, May 1, 2007. pp. 845-856, XP011180981.

Jinshui Chen : "Research and Design of PWM Power Amplifier Based on Resonant Pole Soft Switching", 2015, total 77 pages.

Zhang Yuanzhe et al: "Envelope tracking GaN power supply for 4G cell phone base stations",2016 IEEE Applied Power Electronics Conference and Exposition (APEC), IEEE, Mar. 20, 2016(Mar. 20, 2016), pp. 2292-2297, XP032899097, total 6 pages.

Zhang Yuanzhe et al: "Output filter design in high-efficiency wide-bandwidth multi-phase buck envelope amplifiers", 2015 IEEE Applied Power Electronics Conference and Exposition (APEC), IEEE, Mar. 15, 2015 (Mar. 15, 2015), pp. 2026-2032, XP032775101, total 7 pages.

Vasic Miroslav et al: "The Design of a Multilevel Envelope Tracking Amplifier Based on a Multiphase Buck Converter", IEEE Transactions on Power Electronics, Institute of Electrical and Electronics Engineers, USA, vol. 31 No. 6, Jun. 1, 2016 (Jun. 1, 2016) pp. 4611-4627, XP011591457, total 17 pages.

Chung S et al: "Design considerations on wideband envelope termination for high efficiency RF power amplifiers", Electronics Letters, IEE Stevenage, GB, vol. 52, No. 6, Mar. 17, 2016, pp. 460-462, XP006073891.

* cited by examiner

POWER AMPLIFIER, RADIO REMOTE UNIT, AND BASE STATION

CROSS-REFERENCE TO RELATED APPLICATIONS

This application is a continuation of International Application No. PCT/CN2016/100415, filed on Sep. 27, 2016, the disclosure of which is hereby incorporated by reference in its entirety.

TECHNICAL FIELD

The present invention relates to wireless communications technologies, and in particular, to a power amplifier, a radio remote unit, and a base station.

BACKGROUND

A radio frequency power amplifier (RFPA), briefly referred to as a "power amplifier", is an important component of a radio base station. Parameters such as power consumption, a size, and a heat design of the base station depend on power amplification efficiency. Currently, peak-to-average ratios (PAR) of baseband signals of most multi-carrier and multimode base stations are relatively high, and reach 6 dB to 12 dB. A signal with a high peak-to-average ratio has a higher requirement for a base station power amplifier. The base station power amplifier uses a plurality of high-efficiency power amplification solutions to efficiently amplify the signal with the high peak-to-average ratio without distortion. Currently, envelope tracking is a high-efficiency power amplification technology on which relatively more studies have been made.

The envelope tracking (ET) technology uses a dynamic voltage regulation method in which a signal envelope is used to control a drain voltage or a collector voltage of a radio frequency power amplifier, so that a power amplifier transistor operates in a relatively deep compressed state, such as P-1 dB or P-2 dB, to achieve high efficiency. However, in an existing technical solution, a feeding loop has relatively high inductance. Consequently, a video bandwidth (VBW) indicator is relatively low, and digital predistortion (DPD) correction is affected.

SUMMARY

Embodiments of the present invention provide a radio frequency power amplifier having a new structure, a transceiver, and a base station, to reduce inductance of a power amplifier feeding loop, increase VBW, and improve DPD correction performance.

According to a first aspect, an embodiment of the present invention provides a power amplifier, including a multiphase pulse width modulator, N switching amplifiers, and N low-pass filters. The multiphase pulse width modulator is connected to the N switching amplifiers, and is configured to generate N multiphase pulse-width modulation PWM signals. A switching amplifier Sn is configured to: receive an $n^{th}$ multiphase pulse-width modulation PWMn signal generated by the multiphase pulse width modulator, and amplify the PWMn signal. A low-pass filter Fn is connected to the switching amplifier Sn, and is configured to filter a signal that is output by the switching amplifier Sn. The switching amplifier Sn is an $n^{th}$ switching amplifier in the N switching amplifiers. The low-pass filter Fn is an $n^{th}$ low-pass filter in the N low-pass filters. N and n are positive integers, and $1 \leq n \leq N$.

With reference to the first aspect, in a first possible implementation of the first aspect, the low-pass filter Fn includes a radio frequency decoupling capacitor and a feeder; and one end of the radio frequency decoupling capacitor is connected to the feeder, and the other end of the radio frequency decoupling capacitor is grounded. Optionally, the low-pass filter Fn may further include a low-pass element. One end of the low-pass element is connected to the feeder, and the other end of the low-pass element is connected to the switching amplifier Sn.

With reference to the first aspect, in a second possible implementation of the first aspect, the low-pass filter Fn includes a radio frequency decoupling capacitor and an inductor; and a low-pass element is connected to the inductor, one end of the radio frequency decoupling capacitor is connected to the low-pass element and the inductor, and the other end of the radio frequency decoupling capacitor is grounded. Optionally, the low-pass filter Fn further includes the low-pass element; and one end of the low-pass element is connected to the inductor, and the other end of the low-pass element is connected to the switching amplifier Sn.

With reference to the first or the second possible implementation of the first aspect, in a third possible implementation of the first aspect, a parameter of the low-pass element depends on filtering and choke performance.

In a possible implementation, the power amplifier further includes a radio frequency power amplifier; and the N low-pass filters are connected to an output end of the radio frequency power amplifier to implement choke.

In a possible implementation, the multiphase pulse width modulator includes a field programmable gate array FPGA, an application-specific integrated circuit ASIC, or an analog circuit.

According to a second aspect, an embodiment of the present invention provides a radio remote unit (RRU), including any power amplifier in the foregoing possible implementations.

According to a third aspect, an embodiment of the present invention provides a base station, including the RRU provided in the second aspect.

According to a fourth aspect, an embodiment of the present invention further provides a power amplification method, including: generating N multiphase pulse-width modulation PWM signals; amplifying the multiphase pulse-width modulation PWMn signal; and filtering the multiphase pulse-width modulation PWMn signal. The PWMn signal is an $n^{th}$ multiphase pulse-width modulation signal in the N multiphase pulse-width modulation signals, n is a positive integer, and $1 \leq n \leq N$.

With reference to the fourth aspect, in a possible implementation, the method includes: filtering the multiphase pulse-width modulation PWMn signal.

According to a fifth aspect, an embodiment of the present invention further provides a computer storage medium, configured to store a computer instruction included in various possible implementations of the fourth aspect.

According to the technical solutions provided in the embodiments of the present invention, the multiphase pulse width modulator performs modulation to generate N multiphase pulse-width modulation PWM signals; the multiphase pulse-width modulation PWMn signal is amplified; the multiphase pulse-width modulation PWMn signal is filtered; and combination is performed at a drain or a collector of a power amplifier transistor. According to the new radio frequency amplifier provided in this application, envelope feeding loop inductance can be effectively reduced, so that VBW is increased and DPD correction performance is improved.

BRIEF DESCRIPTION OF DRAWINGS

To describe the technical solutions in the embodiments of the present invention more clearly, the following briefly describes the accompanying drawings required for describing the embodiments. Apparently, the accompanying drawings in the following description show some embodiments of the present invention, and persons of ordinary skill in the art may derive other drawings from these accompanying drawings without creative efforts.

FIG. 1-1 is a schematic structural diagram of a power amplifier according to an embodiment of the present invention;

FIG. 4-1 is a schematic structural diagram of a low-pass filter according to an embodiment of the present invention;

FIG. 4-2 is a schematic structural diagram of a low-pass filter according to an embodiment of the present invention.

DESCRIPTION OF EMBODIMENTS

To make the objectives, technical solutions, and advantages of the embodiments of the present invention clearer, the following clearly describes the technical solutions in the embodiments of the present invention with reference to the accompanying drawings in the embodiments of the present invention. Apparently, the described embodiments are some but not all of the embodiments of the present invention. All other embodiments obtained by persons of ordinary skill in the art based on the embodiments of the present invention without creative efforts shall fall within the protection scope of the present invention.

Various technologies described in this specification may be used to various communications systems, including a 2G communications system such as a Global System for Mobile Communications (GSM), a 3G communications system such as a Wideband Code Division Multiple Access (WCDMA) system or a Time Division-Synchronous Code Division Multiple Access (TD-SCDMA) system, and a next-generation communications system such as a Long Term Evolution (LTE) communications system or a subsequent evolved system of the LTE communications system.

A power amplifier provided in the embodiments of the present invention may be integrated into any network element device, such as a base station, that needs to perform power amplification on a wireless signal. The power amplifier provided in the embodiments of the present invention may operate in a radio frequency part of the base station, for example, may be disposed in a radio remote unit (RRU) of the base station. The base station may be a base transceiver station (BTS) in the GSM system or a CDMA system, a nodeB in the WCDMA system, an evolved NodeB (eNodeB) in the LTE system, or a similar device in the subsequent evolved communications system of LTE.

Figure 1:
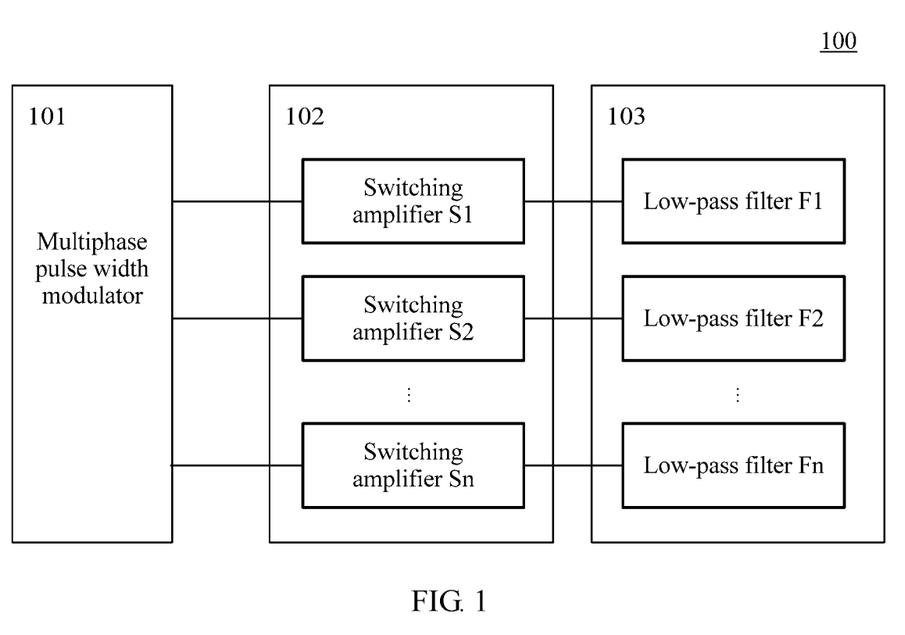
FIG. 1 is a schematic structural diagram of a power amplifier according to an embodiment of the present invention.

FIG. 1 is a schematic structural diagram of a power amplifier according to an embodiment of the present invention. In this embodiment of the present invention, VBW can be effectively increased, and DPD correction performance can be effectively improved.

Figure 11:
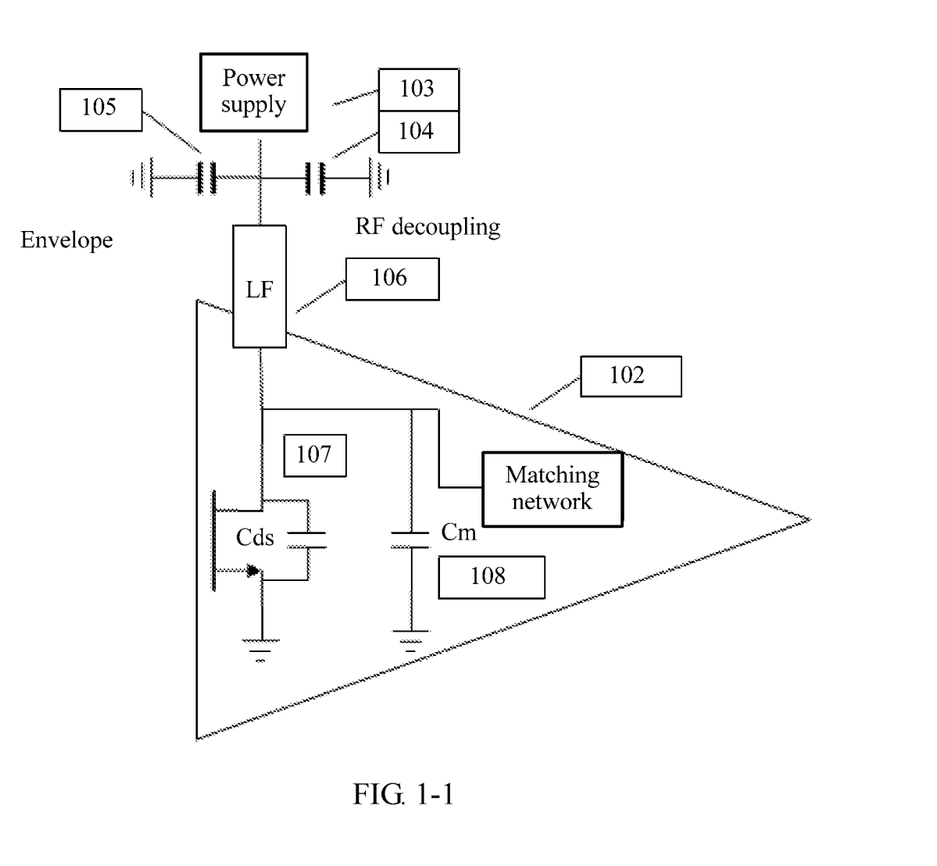

A calculation manner of the VBW may be determined as follows:

For example, as shown in FIG. 1-1, a feeding network of a radio frequency power amplifier with a fixed drain voltage may include the following components. A power supply provides a voltage input, a radio frequency decoupling capacitor 104 implements a radio frequency decoupling function, and an envelope decoupling capacitor 105 implements a bandwidth decoupling function of an envelope signal. Lf 106 implements a radio frequency choke function, and an equivalent inductance value is Lo.

It is assumed that equivalent resistance to ground of a drain of the power amplifier mainly includes a junction capacitor Cds 107 of a power amplifier transistor and an equivalent capacitor Cm of a matching circuit 108. In this case, the VBW of the power amplifier, namely, $FVBW \approx 1/\{2\pi*\sqrt{[Lo*(Cds+Cm)]}\}$.

A power amplification circuit provided in this embodiment may be applied to a processing procedure of amplifying an envelope signal. As shown in FIG. 1, the amplifier 100 provided in this embodiment includes a multiphase pulse width modulator 101, a switching amplifier group 102, and a low-pass filter group 103. An output end of the multiphase pulse width modulator 101 is connected to an input end of the switching amplifier group 102, and an output end of the switching amplifier group 102 is connected to an input end of the low-pass filter group 103.

The multiphase pulse width modulator 101 is configured to: receive a digital in-phase/quadrature (I/Q) signal, modulate the I/Q signal, and generate a plurality of multiphase pulse-width modulation (PWM) signals.

Alternatively, the multiphase pulse width modulator 101 may receive an analog I/Q signal, modulate the analog I/O signal, and generate an analog multiphase PWM signal.

Implementations of the multiphase pulse width modulator 101 may include but are not limited to one of the following: a field programmable gate array (FPGA), an application-specific integrated circuit (ASIC), and an analog circuit.

A manner in which the FPGA or the ASIC implements digital PWM is only to digitize original analog PWM, and there is an implementation solution in the industry. Herein, multiphase PWM is described by using analog PWM as an example.

Figure 2:
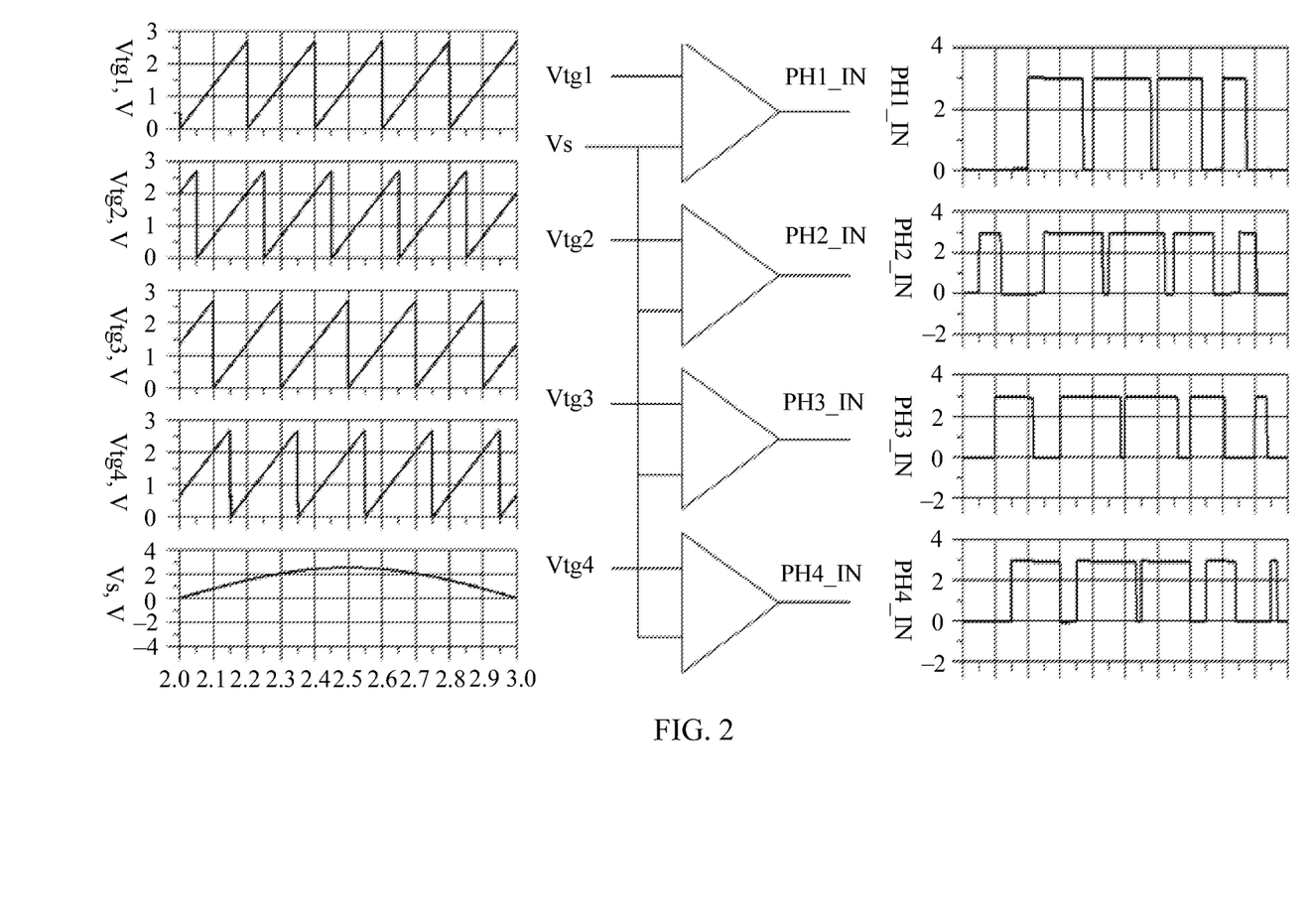
FIG. 2 is a schematic implementation diagram of a power amplifier according to an embodiment of the present invention.

As shown in FIG. 2, a quadrature-phase architecture is used herein as an example to describe a waveform of each point. Triangular waves or sawtooth waves Vtg1, Vtg2, Vtg3, and Vtg4 whose phases are respectively 0°, 90°, 180°, and 270° are generated in a system, and Vs, Vtg1, Vtg2, Vtg3, and Vtg4 are input into a comparator, to obtain signals PH1_IN, PH2_IN, PH3_IN, and PH4_IN. A PWM implementation solution may include the manner described herein, and also include a commonly used sigma-delta modulation scheme.

The multiphase pulse width modulator 101 is connected to the input end of the switching amplifier group 102. The switching amplifier group 102 includes a plurality of independent switching amplifiers. Specifically, as shown by 102 in FIG. 1, the switching amplifier group 102 includes n independent switching amplifiers. As shown by S1 to Sn in 102 in FIG. 1, Sn is an $n^{th}$ switching amplifier in the switching amplifier group 102. All switching amplifiers such as S1 to Sn are connected to the output end of the multiphase pulse width modulator 101. The multiphase pulse width modulator 101 generates at least one PWM signal. Each PWM signal is corresponding to a connected switching amplifier to amplify and balance the PWM signal.

An implementation parameter of the switching amplifier may depend on bandwidth of a traced envelope signal. According to the Nyquist sampling theorem, a switching frequency of the switching amplifier needs to be at least 2 times of a signal frequency. In actual implementation, the switching frequency is usually chosen to be approximately 5 to 10 times of the signal frequency.

An example in which n PWM signals are generated is used. The switching amplifier group 102 is configured to include n switching amplifiers, and each switching amplifier is connected to the output end of the multiphase pulse width modulator 101. Specifically, as shown in FIG. 1, the n switching amplifiers (S1 to Sn) are separately connected to the multiphase pulse width modulator 101.

The low-pass filter group 103 is connected to the switching amplifier group 102. The low-pass filter group 103 includes n independent low-pass filters. As shown by F1 to Fn in FIG. 1, Fn is an $n^{th}$ low-pass filter in the low-pass filter group 103. A single low-pass filter is connected to a single switching amplifier. Specifically, as shown in FIG. 1, S1 is connected to F1, and Sn is connected to Fn. The low-pass filter Fn is configured to filter a signal that is output by the switching amplifier Sn. It may be understood that, a connection between a switching amplifier and a low-pass filter may be implemented by connecting a unified output end of the switching amplifier group 102 and a unified input end of the low-pass filter group 103.

Figure 3:
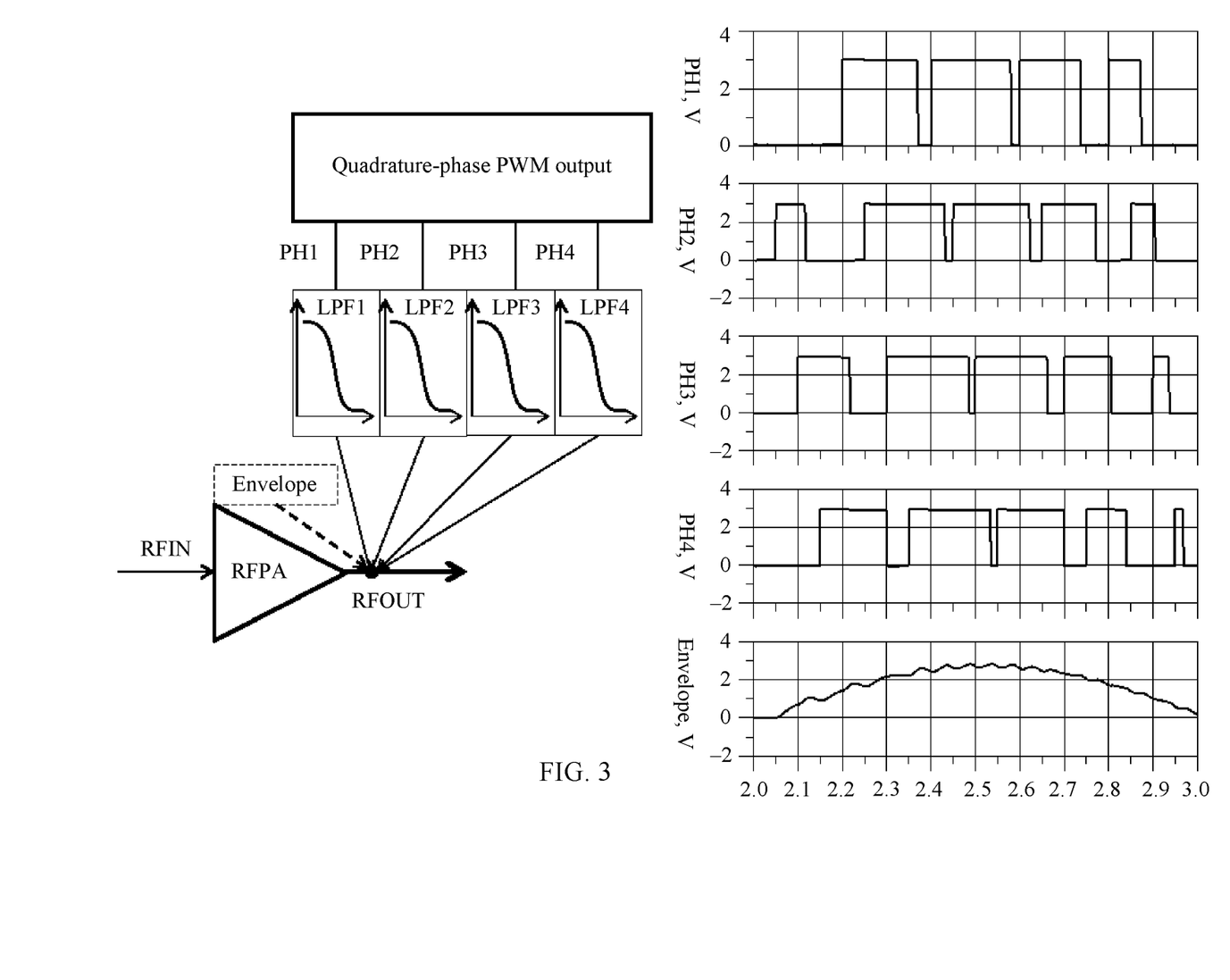
FIG. 3 is a schematic implementation diagram of a power amplifier according to an embodiment of the present invention.

An output end of the low-pass filter group 103 may be further connected to a drain or a collector of the power amplifier transistor, to obtain a complete envelope signal through combination. As shown in FIG. 3, a quadrature-phase architecture is used herein as an example to describe a waveform of each point. PH1, PH2, PH3, and PH4 are respectively waveforms that are output by switching amplifiers, and are combined at the drain or the collector of the power amplifier transistor after passing through LPF1, LPF2, LPF3, and LPF4, to obtain an envelope waveform.

The multiphase pulse width modulator 101, the switching amplifier group 102, the low-pass filter group 103 show a main implementation structure, and an auxiliary circuit may be further included, to implement a complete circuit.

According to the power amplifier provided in this embodiment of the present invention, inductance of a feeding loop can be effectively reduced, so that VBW is increased and DPD correction performance is improved.

Figure 41:
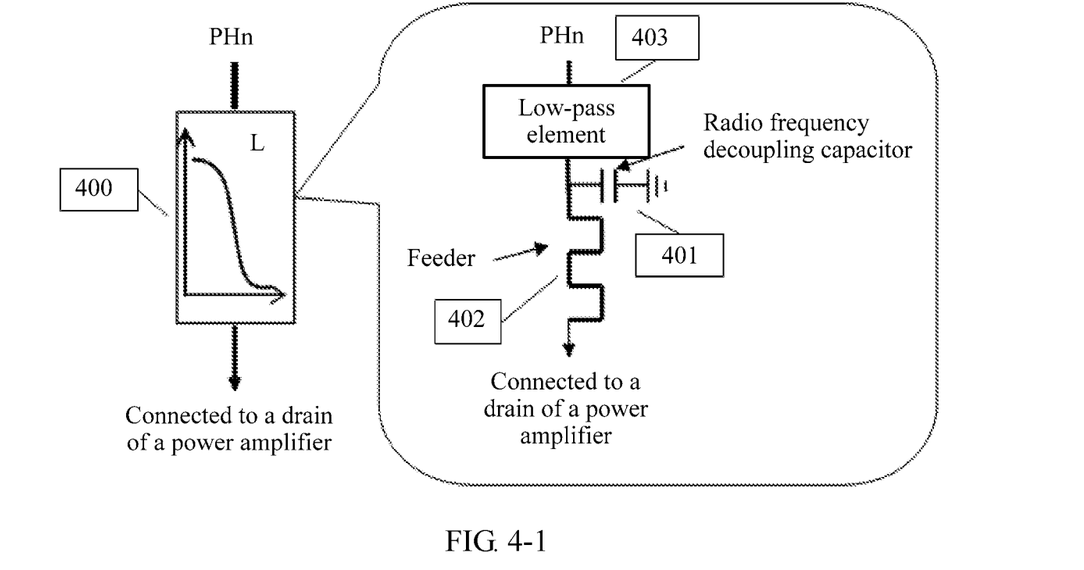

FIG. 4-1 is a schematic structural diagram of a low-pass filter 400 in the low-pass filter group 103. As shown in FIG. 3, the low-pass filter 400 includes a radio frequency decoupling capacitor 401 and a feeder 402. One end of the radio frequency decoupling capacitor 401 is connected to the feeder 402. The other end of the radio frequency decoupling capacitor 401 is grounded.

Optionally, the low-pass filter 400 further includes a low-pass element 403. One end of the low-pass element 403 is connected to the feeder 402, and the other end of the low-pass element 403 is connected to an output end of a switching amplifier.

The low-pass element is used as an optional configuration herein, and the low-pass element may be selected based on a suppression requirement of the feeder 402 and the decoupling capacitor 401 for a radio frequency signal of the drain or the collector of the power amplifier.

Figure 42:
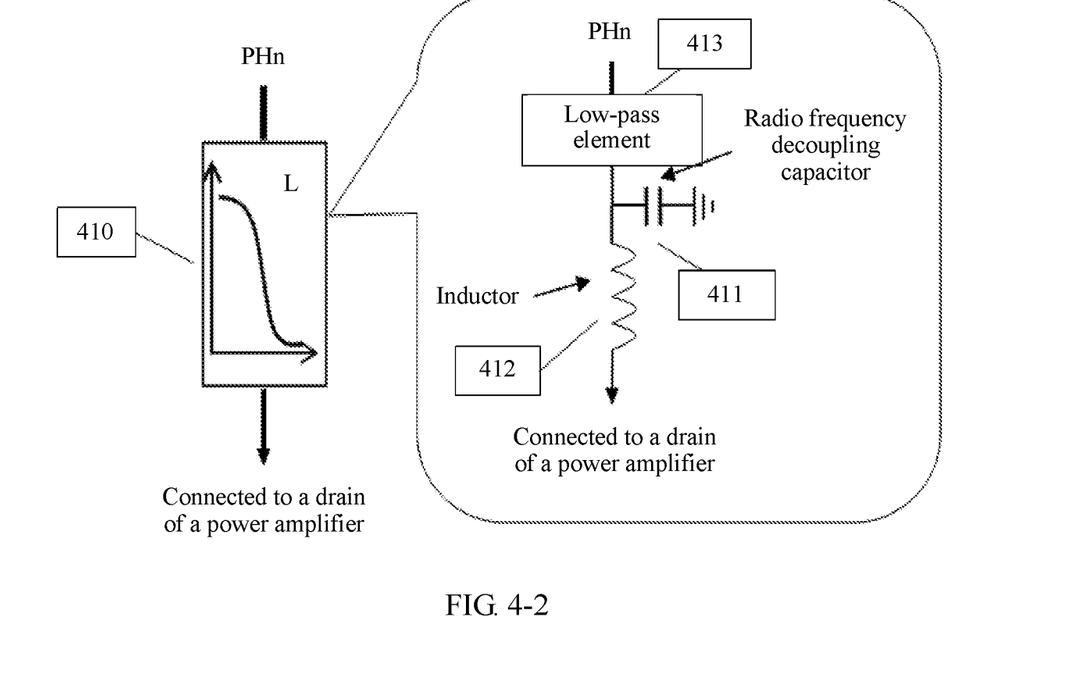

FIG. 4-2 is a schematic structural diagram of another low-pass filter 410 in the low-pass filter group 103. The low-pass filter 410 includes a radio frequency decoupling capacitor 411 and an inductor 412.

One end of the radio frequency decoupling capacitor 411 is connected to the inductor 412. The other end of the radio frequency decoupling capacitor 411 is grounded.

Optionally, the low-pass filter 410 further includes a low-pass element 413. The low-pass element 413 is connected to the inductor 412, and the other end of the low-pass element 413 is connected to an output end of a switching amplifier.

A parameter design of the low-pass element may meet the following condition: A radio frequency signal of the drain or the collector of the power amplifier does not interfere with the switching amplifier.

Optionally, the output end of the low-pass filter group 103 is connected to an output end of the radio frequency power amplifier, to implement choke or matching.

Figure 5:
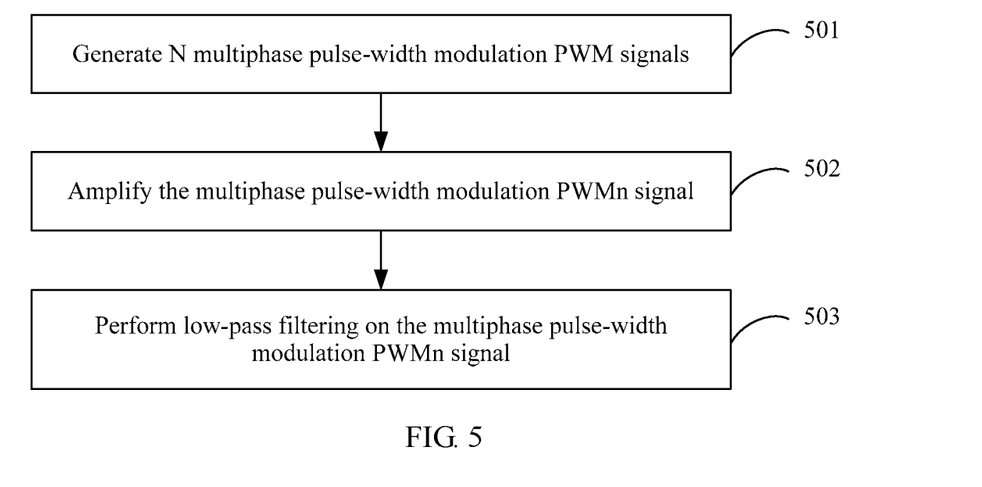
FIG. 5 is a schematic diagram of a power amplification method according to an embodiment of the present invention.

An embodiment of the present invention further provides a power amplification method. As shown in FIG. 5, the method includes the following steps.

S501: A multiphase pulse width modulator performs modulation to generate N multiphase pulse-width modulation PWM signals, where N is a positive integer.

S502: Amplify the multiphase pulse-width modulation PWMn signal.

S503: Perform low-pass filtering on the multiphase pulse-width modulation PWMn signal.

The PWMn signal is an $n^{th}$ multiphase pulse-width modulation signal in the N multiphase pulse-width modulation signals, n is a positive integer, and $1 \leq n \leq N$.

The filtered multiphase pulse-width modulation PWMn signal is choked.

In the power amplification solution provided in this embodiment of the present invention, inductance of a feeding loop can be effectively reduced, so that VBW is increased and DPD correction performance is improved.

It may be understood that, persons of ordinary skill in the art may make various proper changes to quantities of envelope modulators and auxiliary power amplifiers of the power amplifier and a corresponding connection relationship based on the descriptions of the embodiments of the present invention without creative efforts, and such changes shall fall within the protection scope of the present invention.

In the several embodiments provided herein, it should be understood that the disclosed device and method may be implemented in other manners. For example, the described apparatus embodiment is merely an example. For example, the module division is merely logical function division and may be other division in actual implementation. For example, a plurality of modules or components may be combined or integrated into another device, or some features may be ignored or not performed.

In addition, function modules in the embodiments of the present invention may be integrated into one processing module, or each of the modules may exist alone physically, or two or more modules are integrated into one module.

Persons of ordinary skill in the art may understand that all or some steps of the embodiments may be implemented by hardware or a program instructing related hardware. The program may be stored in a computer-readable storage medium. The storage medium may be a read-only memory, a magnetic disk, an optical disc, or the like.

Finally, it should be noted that the foregoing embodiments are merely intended to describe the technical solutions of the present invention, but are not intended to limit the present invention. Although the present invention is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present invention.

What is claimed is:

1. A power amplifier, comprising a multiphase pulse width modulator, N switching amplifiers including a switching amplifier Sn, and N low-pass filters including a low-pass filter Fn, wherein N is a positive integer; and, wherein
the multiphase pulse width modulator is connected to the N switching amplifiers, and is configured to generate N multiphase pulse-width modulation (PWM) signals;
the switching amplifier Sn is configured to: receive an nth multiphase pulse-width modulation (PWMn) signal generated by the multiphase pulse width modulator, and amplify the PWMn signal, wherein the switching amplifier Sn is an nth switching amplifier in the N switching amplifiers; and
the low-pass filter Fn is connected to the switching amplifier Sn, and is configured to filter a signal that is output by the switching amplifier Sn, wherein the low-pass filter Fn is an nth low-pass filter in the N low-pass filters, n is a positive integer, and 1≤n≤N, wherein
the low-pass filter Fn comprises a radio frequency decoupling capacitor and a feeder, wherein one end of the radio frequency decoupling capacitor is connected to the feeder, and the other end of the radio frequency decoupling capacitor is grounded;
the low-pass filter Fn further comprises a low-pass element, wherein one end of the low-pass element is connected to the feeder, and the other end of the low-pass element is connected to the switching amplifier Sn; and
a parameter of the low-pass element depends on filtering and choke performance.

2. The power amplifier according to claim 1, wherein the low-pass filter Fn comprises a radio frequency decoupling capacitor and an inductor, wherein
a low-pass element is connected to the inductor, one end of the radio frequency decoupling capacitor is connected to the low-pass element and the inductor, and the other end of the radio frequency decoupling capacitor is grounded.

3. The power amplifier according to claim 2, wherein
the low-pass filter Fn further comprises the low-pass element; and
one end of the low-pass element is connected to the inductor, and the other end of the low-pass element is connected to the switching amplifier Sn.

4. The power amplifier according to claim 1, wherein
the power amplifier further comprises a radio frequency power amplifier; and
the N low-pass filters are connected to an output end of the radio frequency power amplifier to implement choke.

5. The power amplifier according to claim 1, wherein
the multiphase pulse width modulator comprises a field programmable gate array (FPGA), an application-specific integrated circuit ASIC, or an analog circuit.

6. The power amplifier according to claim 1, wherein the power amplifier is included in a radio remote unit (RRU).

7. The power amplifier according to claim 1, wherein the power amplifier is included in a base station.

8. A power amplification method, comprising:
generating N multiphase pulse-width modulation (PWM) signals, wherein N is a positive integer;
amplifying a multiphase pulse-width modulation (PWMn) signal; and
performing, by a low-pass filter, low-pass filtering on the multiphase pulse-width modulation PWMn signal, wherein
the PWMn signal is an nth multiphase pulse-width modulation signal in the N multiphase pulse-width modulation signals, n is a positive integer, and 1≤n≤N,
the low-pass filter comprises a radio frequency decoupling capacitor and a feeder, wherein one end of the radio frequency decoupling capacitor is connected to the feeder, and the other end of the radio frequency decoupling capacitor is grounded;
the low-pass filter further comprises a low-pass element, wherein one end of the low-pass element is connected to the feeder, and the other end of the low-pass element is connected to the switching amplifier Sn; and
a parameter of the low-pass element depends on filtering and choke performance.

9. The power amplification method according to claim 8, comprising:
choking the filtered multiphase pulse-width modulation (PWMn) signal.

* * * * *